United States Patent
Chen et al.

(10) Patent No.: US 7,808,006 B2
(45) Date of Patent: Oct. 5, 2010

(54) WHITE-EMITTING PHOSPHORS AND LIGHTING APPARATUS USING THE SAME

(75) Inventors: Teng-Ming Chen, Hsinchu (TW); Chun-Kuei Chang, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 12/429,248

(22) Filed: Apr. 24, 2009

(65) Prior Publication Data

US 2010/0019262 A1 Jan. 28, 2010

(30) Foreign Application Priority Data

Jul. 24, 2008 (TW) ............................... 97128051 A

(51) Int. Cl.
H01L 33/00 (2010.01)
(52) U.S. Cl. .............................. 257/79; 257/81; 257/82; 257/91; 257/98; 257/99; 257/40; 257/E33.056; 257/E33.059; 257/E25.032; 257/E25.008; 257/E25.009; 438/22
(58) Field of Classification Search .................... 257/81, 257/82, 91, 98–100, E33.056, E33.059, E25.032, 257/40, E51.001, E51.052, E25.008, E25.009; 438/22, 48
See application file for complete search history.

(56) References Cited

U.S. PATENT DOCUMENTS

| 5,998,925 A | 12/1999 | Shimizu et al. |
| 2005/0247951 A1* | 11/2005 | Lin et al. ................... 257/100 |
| 2008/0283857 A1* | 11/2008 | Chen et al. ................... 257/98 |

FOREIGN PATENT DOCUMENTS

JP H10-056208 A 2/1998

OTHER PUBLICATIONS

Appl. Phys. Lett. 94,vol. 9, pp. 091902 (2009); doi:10.1063/1.3094753 (3 pages) Sr3Al2O5Cl2:Ce3+,Eu2+: A potential tunable yellow-to-white-emitting phosphor for ultraviolet light emitting diodes Yanhua Song, Guang Jia, Mei Yang, Yeju Huang, Hongpeng You, and Hongjie Zhang.*
W.Leib and H. Muller-Buschbuem, Sr3Al2O5Cl2, ein Oxohalogenoaluminat mit Ba3Fe2O5Cl2-Struktur, Revue de Chimie minerale, 1986, p. 760-765, 23, Gauthier-Villars, Paris, FR.

* cited by examiner

Primary Examiner—Davienne Monbleau
Assistant Examiner—Farid Khan
(74) Attorney, Agent, or Firm—Muncy, Geissler, Olds & Lowe, PLLC

(57) ABSTRACT

A phosphor has a general formula of $(M_{1-m-n}Ce_m Eu_n)_3Al_2O_5X_2$, wherein M is at least one selected from the group consisting of Ca, Sr and Ba; and X is at least one selected from the group consisting of Cl and Br, while $0<m<1$ and $0<n<1$.

10 Claims, 3 Drawing Sheets

WHITE-EMITTING PHOSPHORS AND LIGHTING APPARATUS USING THE SAME

BACKGROUND OF THE INVENTION

1. Technical Field

The present invention relates to a type of phosphors, and more particularly, to a type of phosphors for use in white-light lighting apparatuses.

2. Description of Related Art

Semiconductor lighting apparatuses include light-emitting diodes (LEDs) and laser diodes. Semiconductor lighting apparatuses which provide ultraviolet or near-ultraviolet light can be used in combination with different phosphors to make various kinds of light sources.

Of all the new products in the LED industry, white light-emitting diodes are the most promising ones because they provide such advantages as having small sizes, low heat generation, low power consumption and long service life. Therefore, white light-emitting diodes can be used to replace fluorescent lamps and back lights of flat-panel displays. The so-call "white light" is in fact a combination of colored lights having various wavelengths. A white light visible to the human eyes must comprise a combination of lights of at least two colors, such as a combination of blue and yellow lights or a combination of green, blue and red lights.

Presently, most of the commoditized white-light lighting apparatuses generate a white light by using blue LED to convert yellow-emitting phosphor powder of $Y_3Al_5O_{12}$:Ce (YAG:Ce) into a white light. This commoditized yellow-emitting phosphor powder is prepared through a solid-state sintering reaction at a high temperature ranging from 1400° C. to 1600° C., and can be excited by a blue LED having an emission wavelength of 467 nm to produce a yellow light having an emission wavelength of 550 nm, whose CIE chromaticity coordinates are (0.48, 0.50).

This yellow-emitting phosphor powder for use with a blue LED is synthesized under strict conditions, e.g., through a solid-state sintering reaction at a relatively high temperature, and emits a light that lacks a blue light component, so as to show a poor color-rendering property when used in a white-light lighting apparatus.

BRIEF SUMMARY OF THE INVENTION

In order to solve the aforesaid problems, the present invention provides a white-emitting phosphor having a general formula of $(M_{1-m-n}Ce_mEu_n)_3Al_2O_5X_2$, wherein M is at least one selected from the group consisting of Ca, Sr and Ba; and X is at least one selected from the group consisting of Cl and Br, while 0<m<1 and 0<n<1.

The present invention also provides a white-emitting phosphor having a general formula of $(M_{1-n}Eu_n)_3Al_2O_5X_2$, wherein M is at least one selected from the group consisting of Ca, Sr and Ba; and X is at least one selected from the group consisting of Cl and Br, while 0<n<1.

The present invention further provides a lighting apparatus comprising a semiconductor light source and a white-emitting phosphor having a general formula of $(M_{1-m-n}Ce_mEu_n)_3Al_2O_5X_2$, wherein M is at least one selected from the group consisting of Ca, Sr and Ba; and X is at least one selected from the group consisting of Cl and Br, while 0<m<1 and 0<n<1.

The present invention also provides a lighting apparatus comprising a semiconductor light source and a white-emitting phosphor having a general formula of $(M_{1-n}Eu_n)_3Al_2O_5X_2$, wherein M is at least one selected from the group consisting of Ca, Sr and Ba; and X is at least one selected from the group consisting of Cl and Br, while 0<n<1.

Therefore, a primary objective of the present invention is to provide a series of white-emitting phosphors having novel compositions.

Another objective of the present invention is to provide a series of white-emitting phosphors for use in lighting apparatuses and capable of providing a broadband radiation source.

Still another objective of the present invention is to provide a series of white-emitting phosphors whose compositions can be adjusted to change colors of light emitted therefrom.

Yet another objective of the present invention is to provide a series of white-emitting phosphors prepared at medium to low temperatures.

A further objective of the present invention is to provide a lighting apparatus comprising a semiconductor light source and a phosphor.

BRIEF DESCRIPTION OF THE SEVERAL VIEWS OF THE DRAWINGS

The invention as well as a preferred mode of use, further objectives and advantages thereof will be best understood by referring to the following detailed description of illustrative embodiments in conjunction with the accompanying drawings, wherein.

DETAILED DESCRIPTION OF THE INVENTION

A detailed description of the present invention will be given below with reference to preferred embodiments thereof, so that a person skilled in the art can readily understand features and functions of the present invention after reviewing the contents disclosed herein. The present invention can also be implemented by or applied in other embodiments, where changes and modifications can be made to the disclosed details from a viewpoint different from that adopted in this specification without departing from the spirit of the present invention.

A white-emitting phosphor according to a first preferred embodiment of the present invention is prepared through a solid-state reaction at medium to low temperatures (800° C.~1100° C.). Taking $(Sr_{1-m-n}Ce_mEu_n)_3Al_2O_5Cl_2$ (0<m<1; 0<n<1) for example, it is prepared by a method comprising the following steps. To begin with, strontium oxide (SrO), strontium chloride ($SrCl_2$), aluminum oxide ($Al_2O_3$), cerium oxide ($CeO_2$) and europium sesquioxide ($Eu_2O_3$) are weighed stoichiometrically, ground and thoroughly mixed. Then, the resultant mixture is put into a crucible and placed in a high-temperature furnace to be sintered in a hydrogen and argon atmosphere at a temperature ranging from about 800° C. to about 1100° C. for four to eight hours. The final product is the white-emitting phosphor according to the first preferred embodiment of the present invention and has a chemical formula of $(Sr_{1-m-n}Ce_mEu_n)_3Al_2O_5Cl_2$, wherein $0<m<1$ and $0<n<1$.

In the method described above, strontium chloride ($SrCl_2$) can be replaced by various metal salts such as strontium bromide ($SrBr_2$), calcium chloride ($CaCl_2$), calcium bromide ($CaBr_2$), barium bromide ($BaBr_2$) or barium chloride ($BaCl_2$), while strontium oxide (SrO) can also be replaced by various metal salts such as calcium oxide (CaO) or barium oxide (BaO). Use of different metal salts leads to the various phosphors disclosed in the present invention. The white-emitting phosphor $(Sr_{1-m-n}Ce_mEu_n)_3Al_2O_5Cl_2$ ($0<m<1$; $0<n<1$) of the present invention can be excited by an ultraviolet light, a near-ultraviolet light or a blue light to emit lights in two emission bands, which fall into a blue light zone and a yellow-orange light zone, respectively. The phosphor $(Sr_{1-m-n}Ce_mEu_n)_3Al_2O_5Cl_2$ ($0<m<1$; $0<n<1$) can be excited by a radiation source having a wavelength ranging from about 300 nm to about 370 nm to emit lights in two emission bands, wherein the lights are combined to produce a light having an x chromaticity coordinate of about 0.25 to 0.50 and a y chromaticity coordinate of about 0.25 to 0.40.

Figure 1:
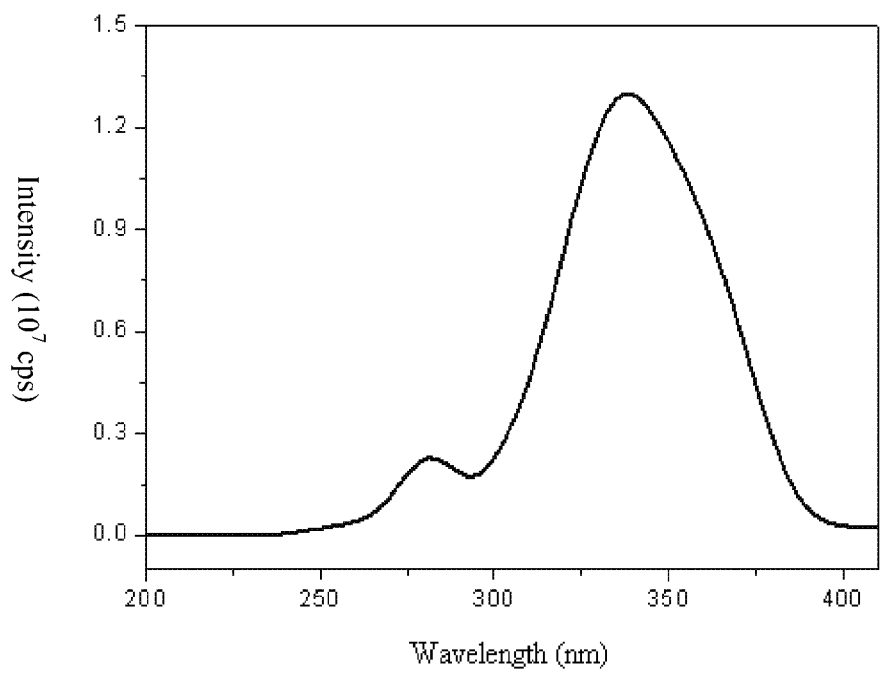
FIG. 1 is an excitation spectrum of a first preferred embodiment of the present invention.
Figure 2:
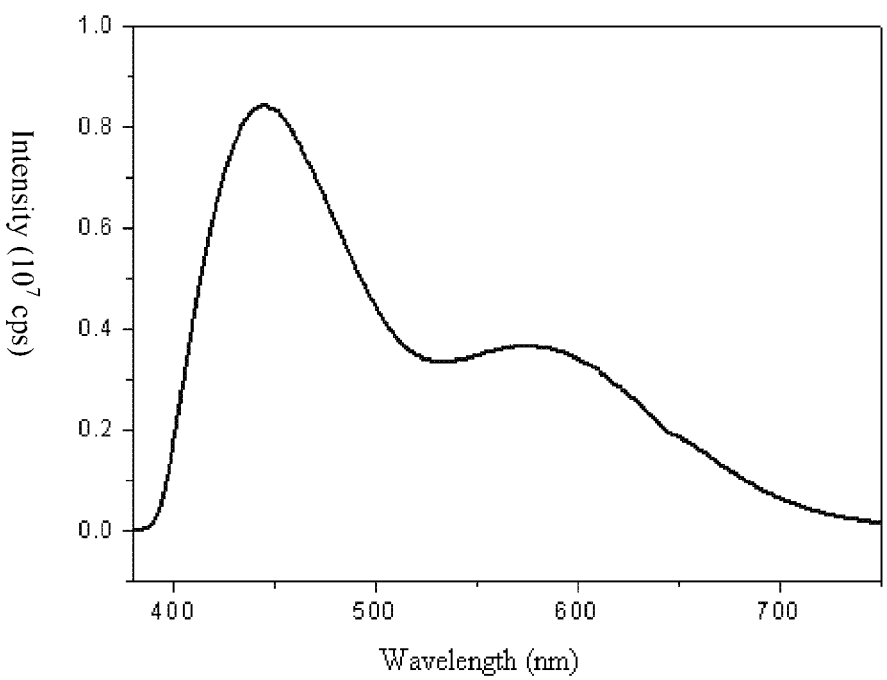
FIG. 2 is a photoluminescence spectrum of the first preferred embodiment of the present invention.

FIGS. 1 and 2 show respectively an excitation spectrum and a photoluminescence spectrum of a white-emitting phosphor $(Sr_{0.987}Ce_{0.01}Eu_{0.003})_3Al_2O_5Cl_2$ synthesized according to the first preferred embodiment of the present invention. It is shown that the white-emitting phosphor $(Sr_{0.987}Ce_{0.01}Eu_{0.003})_3Al_2O_5Cl_2$ has an optimal excitation wavelength of 340 nm and, when excited by a 340 nm radiation source, emits lights having wavelengths of 438 nm and 583 nm simultaneously, which belong to a blue light zone and a yellow-orange light zone, respectively. The lights having these two wavelengths are combined to produce a white light.

When excited by an ultraviolet light having a wavelength ranging from about 300 nm to about 370 nm, the phosphor $(M_{1-m-n}Ce_mEu_n)_3Al_2O_5X_2$ of the present invention can be made to emit lights having different chromaticities by adjusting a ratio between m and n in the general formula. For example, when m is a constant greater than 0, the phosphor will have an emission band in a blue light zone if m>>n, in a white light zone if 0.5>n>0, and in a yellow-orange light zone if n>>m.

Figure 3:
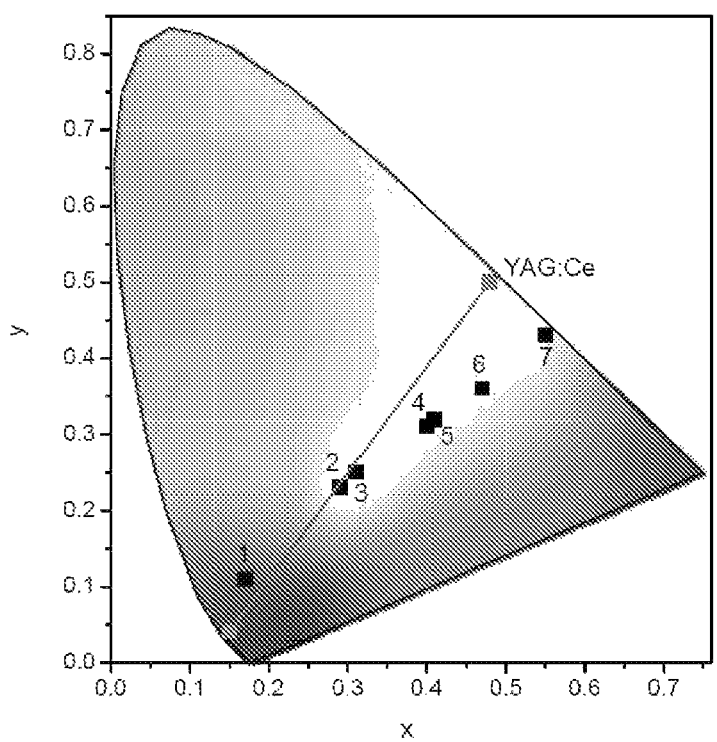
FIG. 3 shows a comparison of chromaticity coordinates between lights emitted from the first preferred embodiment of the present invention and a white light simulated with a YAG:Ce product.

Table 1 shows a comparison of chromaticities of $(Sr_{1-m-n}Ce_mEu_n)_3Al_2O_5Cl_2$ as a function of m and n values when excitation wavelengths are modulated. The variation of chromaticities of points 1 to 7 in the table is plotted in FIG. 3. It can be known from the points 1 through 7 that, with an excitation wavelength of 340 nm, $(Sr_{1-m-n}Ce_mEu_n)_3Al_2O_5Cl_2$ can be made to emit lights in a blue light zone, a white light zone, a yellow light zone, etc. by adjusting the m and n values. The line labeled with YAG:Ce in FIG. 3 represents a white light simulated with a YAG:Ce product and a blue LED chip. A comparison between chromaticity coordinates of lights emitted from the phosphor of the present invention and the YAG:Ce line shows that the phosphor of the present invention exhibits a better color-rendering property.

TABLE 1

| Excitation wavelength (nm) | Point | $(Sr_{1-m-n}Ce_mEu_n)_3Al_2O_5Cl_2$ | | (x, y) |
|---|---|---|---|---|
| 340 | 1 | m = 0.01 | n ≈ 0 | (0.17, 0.11) |
|  | 2 | m = 0.01 | n = 0.003 | (0.29, 0.23) |
|  | 3 | m = 0.01 | n = 0.005 | (0.31, 0.25) |
|  | 4 | m = 0.01 | n = 0.007 | (0.40, 0.31) |
|  | 5 | m = 0.01 | n = 0.01 | (0.41, 0.32) |
|  | 6 | m = 0.01 | n = 0.03 | (0.47, 0.36) |
| 357 | 7 | m ≈ 0 | n ≈ 1.0 | (0.55, 0.43) |
| 467 |  | Simulated white light with YAG:Ce | | (0.31, 0.27) |

A white-emitting phosphor according to a second preferred embodiment of the present invention is prepared through a solid-state reaction at medium to low temperatures (800° C.~1100° C.). Taking $(Sr_{1-n}Eu_n)_3Al_2O_5Cl_2$ ($0<n<1$) for example, it is prepared by a method comprising the following steps. First of all, strontium oxide (SrO), strontium chloride ($SrCl_2$), aluminum oxide ($Al_2O_3$), cerium oxide ($CeO_2$) and europium sesquioxide ($Eu_2O_3$) are weighed stoichiometrically, ground and thoroughly mixed. Afterward, the resultant mixture is put into a crucible and placed in a high-temperature furnace to be sintered in a hydrogen and argon atmosphere at a temperature ranging from about 800° C. to about 1100° C. for four to eight hours. The final product is the phosphor according to the second preferred embodiment of the present invention and has a chemical formula of $(Sr_{1-n}Eu_n)_3Al_2O_5Cl_2$, wherein $0<n<1$.

In the method described above, strontium chloride ($SrCl_2$) can be replaced by various metal salts such as strontium bromide ($SrBr_2$), calcium chloride ($CaCl_2$), calcium bromide ($CaBr_2$), barium bromide ($BaBr_2$) or barium chloride ($BaCl_2$), while strontium oxide (SrO) can also be replaced by various metal salts such as calcium oxide (CaO) or barium oxide (BaO). Different metal salts can be selected to obtain the various phosphors disclosed in the present invention.

Figure 4:
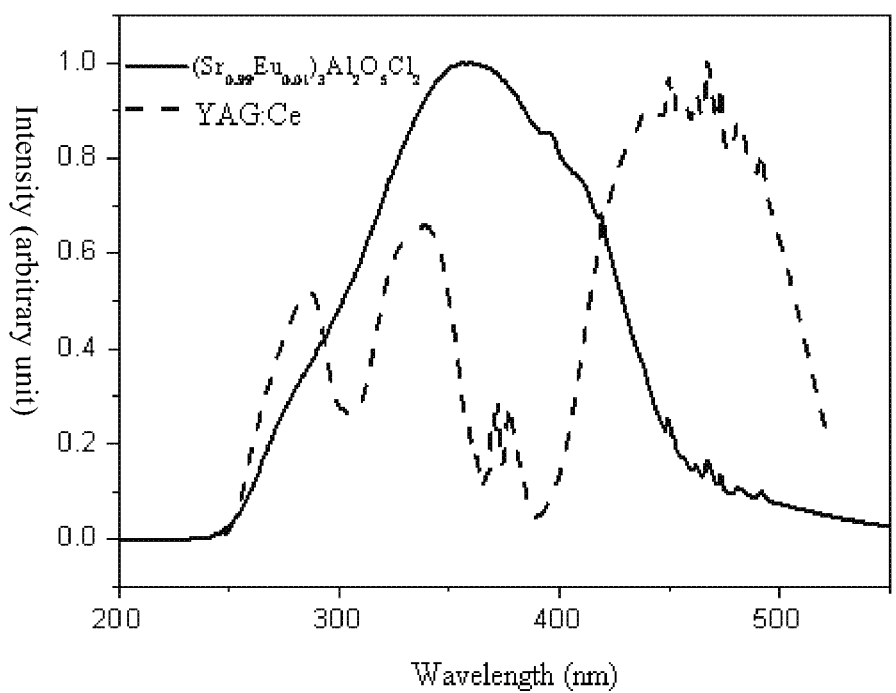
FIG. 4 shows a comparison of excitation spectra between a second preferred embodiment of the present invention and a YAG:Ce product.

FIG. 4 shows a comparison of excitation spectra between $(Sr_{0.99}Eu_{0.01})_3Al_2O_5Cl_2$ prepared by the method described above and a YAG:Ce phosphor product. As shown in the drawing, the phosphor $(Sr_{0.99}Eu_{0.01})_3Al_2O_5Cl_2$ synthesized according to the present invention can be excited by a radiation source having a wavelength ranging from about 300 nm to about 430 nm, namely an ultraviolet light, a near-ultraviolet light or a blue light. On the other hand, the excitation spectrum of the YAG:Ce product reveals that the YAG:Ce product can be effectively excited only in a blue light zone.

Figure 5:
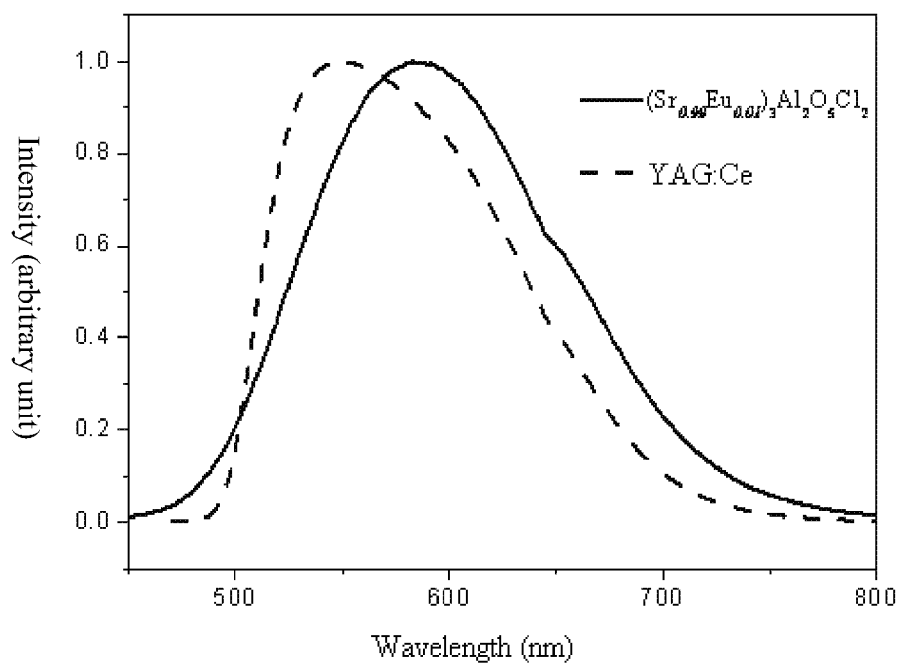
FIG. 5 shows a comparison of photoluminescence spectra between the second preferred embodiment of the present invention and a YAG:Ce product.

Referring to FIG. 5, a comparison is made of photoluminescence spectra between a white-emitting phosphor $(Sr_{0.99}Eu_{0.01})_3Al_2O_5Cl_2$ prepared according to the second preferred embodiment of the present invention and a YAG:Ce product, as detected by a fluorescence spectrophotometer. It is shown that the white-emitting phosphor $(Sr_{0.99}Eu_{0.01})_3Al_2O_5Cl_2$ of the present invention can be excited by a radiation source having a wavelength of 360 nm, so as to emit a light in an emission band ranging from about 500 nm to about 740 nm, wherein a major emission peak is a yellow-orange light having a wavelength of about 583 nm. On the other hand, the YAG:Ce phosphor product has an emission band ranging from about 500 nm to about 700 nm, wherein a major emission peak is a yellow light having a wavelength of about 550 nm. By comparison, the white-emitting phosphor $(Sr_{0.99}Eu_{0.01})_3Al_2O_5Cl_2$ of the present invention exhibits a red shift in its emission range. FIGS. 3 and 4 have proved that, when this yellow-orange-emitting phosphor powder is used in conjunction with a radiation source having a wavelength ranging from about 300 nm about 430 nm, the light emitted from the phosphor powder will be combined with the radiation source to produce a white light having an improved color-rendering property.

The white-emitting phosphor $(Sr_{1-n}Eu_n)_3Al_2O_5Cl_2$ of the present invention can be excited by an ultraviolet light, a near-ultraviolet light or a blue light to produce a yellow-orange light having an x chromaticity coordinate of about 0.40 to 0.60 and a y chromaticity coordinate of about 0.40 to 0.50. When excited by a radiation source having a wavelength ranging from about 380 nm to about 440 nm, the white-emitting phosphor $(Sr_{1-n}Eu_n)_3Al_2O_5Cl_2$ emits a yellow-orange light that is combined with the radiation source to produce a white light whose x chromaticity coordinate is about 0.25 to 0.50 and whose y chromaticity coordinate is about 0.40 to 0.50.

Figure 6:
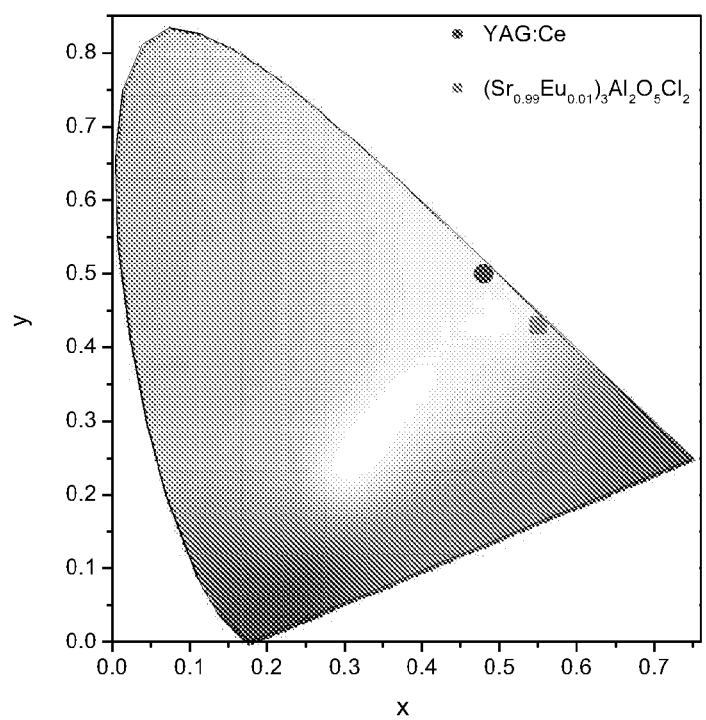
FIG. 6 shows a comparison of CIE chromaticity coordinates between the second preferred embodiment of the present invention and a YAG:Ce product.

As shown in FIG. 6, the white-emitting phosphor $(Sr_{0.99}Eu_{0.01})_3Al_2O_5Cl_2$ of the present invention is compared with a commoditized YAG:Ce phosphor in terms of CIE chromaticity coordinates. The white-emitting phosphor $(Sr_{0.99}Eu_{0.01})_3Al_2O_5Cl_2$ of the present invention is excited by a 360 nm excitation source to emit a yellow-orange light having chromaticity coordinates of (0.55, 0.43). In contrast, the YAG:Ce product is excited by a 467 nm excitation source to emit a yellow light having chromaticity coordinates of (0.48, 0.50).

Therefore, the phosphors disclosed in the present invention can be used in a lighting apparatus comprising a semiconductor light source such as an LED or a laser diode, wherein the semiconductor light source can emit an ultraviolet light, a near-ultraviolet light or a blue light. A semiconductor light source using the white-emitting phosphors of the present invention can emit color lights in different emission bands.

In conclusion, the white-emitting phosphors according to the present invention have novel compositions, can be prepared at medium to low temperatures, have broad excitation ranges (from an ultraviolet zone to a blue light zone) and can therefore be used in combination with commercially available ultraviolet- or blue-light radiation source chips. Furthermore, by adjustment of compositions, the phosphors of the present invention can have their emission bands modified so as to span across a blue light zone, a white light zone and a yellow-orange light zone.

The preferred embodiments of the present invention are herein provided for illustrative purposes only and not intended to limit the scope of the present invention in any way. Moreover, as the contents disclosed herein should be readily understood and can be implemented by a person skilled in the art, all equivalent changes or modifications which do not depart from the spirit of the present invention should be encompassed by the appended claims.

The invention claimed is:

1. A white-emitting phosphor, having a general formula of:

$(M_{1-m-n}Ce_mEu_n)_3Al_2O_5X_2$;

wherein M is at least one selected from the group consisting of Ca, Sr and Ba; and X is at least one selected from the group consisting of Cl and Br; wherein 0<m<1 and 0<n<1.

2. The white-emitting phosphor of claim 1, wherein the white-emitting phosphor is excitable by an ultraviolet light, a near-ultraviolet light or a blue light.

3. The white-emitting phosphor of claim 2, wherein the white-emitting phosphor has an emission band ranging from a blue light zone to a yellow-orange light zone when excited.

4. The white-emitting phosphor of claim 2, wherein the white-emitting phosphor has two emission bands falling in a blue light zone and a yellow-orange light zone, respectively, when excited.

5. The white-emitting phosphor of claim 1, wherein the white-emitting phosphor can be excited by a radiation source having a wavelength ranging from about 300 nm to about 370 nm, so as to emit a light having an x chromaticity coordinate of about 0.25 to 0.50 and a y chromaticity coordinate of about 0.25 to 0.40.

6. The white-emitting phosphor of claim 1, wherein an emission range of the white-emitting phosphor when excited is changed by adjusting a ratio between m and n in the general formula.

7. The white-emitting phosphor of claim 1, wherein the white-emitting phosphor is prepared by a solid-state method at a sintering temperature ranging from about 800° C. to about 1100° C.

8. A lighting apparatus, comprising:
a semiconductor light source; and
a white-emitting phosphor excitable by the semiconductor light source and having a general formula of:

$(M_{1-m-n}Ce_mEu_n)_3Al_2O_5X_2$, wherein M is at least one selected from the group consisting of Ca, Sr and Ba; and X is at least one selected from the group consisting of Cl and Br; wherein 0<m<1 and 0<n<1.

9. The lighting apparatus of claim 8, wherein the semiconductor light source is a light-emitting diode or a laser diode.

10. The lighting apparatus of claim 8, wherein the semiconductor light source emits an ultraviolet light, a near-ultraviolet light or a blue light.

* * * * *